US011749663B2

(12) United States Patent
Gomes et al.

(10) Patent No.: US 11,749,663 B2
(45) Date of Patent: Sep. 5, 2023

(54) DEVICE, METHOD AND SYSTEM FOR PROVIDING A STACKED ARRANGEMENT OF INTEGRATED CIRCUIT DIES

(71) Applicant: Intel Corporation, Santa Clara, CA (US)

(72) Inventors: Wilfred Gomes, Portland, OR (US); Mark Bohr, Aloha, OR (US); Glenn J. Hinton, Portland, OR (US); Rajesh Kumar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/742,205

(22) Filed: May 11, 2022

(65) Prior Publication Data
US 2022/0271022 A1 Aug. 25, 2022

Related U.S. Application Data

(62) Division of application No. 16/646,460, filed as application No. PCT/US2017/068831 on Dec. 28, 2017, now Pat. No. 11,373,987.

(51) Int. Cl.
*H01L 21/00* (2006.01)
*H01L 25/18* (2023.01)
(Continued)

(52) U.S. Cl.
CPC ............ *H01L 25/18* (2013.01); *H01L 23/481* (2013.01); *H01L 23/5386* (2013.01);
(Continued)

(58) Field of Classification Search
CPC .... H01L 25/18; H01L 23/481; H01L 23/5386
See application file for complete search history.

(56) References Cited

U.S. PATENT DOCUMENTS 8,803,545 B2 * 8/2014 Yoko ...................... G11C 29/02
324/762.01
10,014,263 B2 7/2018 Shuto
(Continued)

FOREIGN PATENT DOCUMENTS

KR 10-2015-0001635 1/2015
WO WO-2015-191243 12/2015
(Continued)

OTHER PUBLICATIONS

International Search Report and Written Opinion for International Patent Application No. PCT/US2017/068831 dated Sep. 27, 2018, 15 pgs.
(Continued)

*Primary Examiner* — Laura M Menz
(74) *Attorney, Agent, or Firm* — Schwabe, Williamson & Wyatt, P.C.

(57) ABSTRACT

Techniques and mechanisms for providing interconnected circuitry of an integrated circuit (IC) die stack. In an embodiment, first integrated circuitry of a first IC die is configured to couple, via a first interconnects of the first IC die, to second integrated circuitry of a second IC die. When the first IC die and the second IC die are coupled to one another, second interconnects of the first IC die are further coupled to the second integrated circuitry, wherein the second interconnects are coupled to each of two opposite sides of the first IC die. In another embodiment, the second integrated circuitry includes processor logic, and the first integrated circuitry is configured to cache data for access by the processor logic. In another embodiment, the first integrated circuitry includes a power delivery circuit and an on-package input-output interface to cache data for access by the processor logic at higher bandwidth with lower power consumption.

20 Claims, 8 Drawing Sheets

(51) Int. Cl.
*H01L 23/48* (2006.01)
*H01L 23/538* (2006.01)
*H01L 23/00* (2006.01)
*H01L 25/065* (2023.01)

(52) U.S. Cl.
CPC .............. *H01L 24/13* (2013.01); *H01L 24/81* (2013.01); *H01L 25/0652* (2013.01); *H01L 2924/1431* (2013.01); *H01L 2924/1436* (2013.01)

(56) References Cited

U.S. PATENT DOCUMENTS

| | | | |
|---|---|---|---|
| 11,373,987 B2* | 6/2022 | Gomes | H01L 25/0652 |
| 2011/0175639 A1* | 7/2011 | Yoko | G11C 29/025 257/E23.011 |
| 2015/0028486 A1 | 1/2015 | Liu et al. | |
| 2016/0049389 A1 | 2/2016 | Chen et al. | |
| 2017/0092602 A1* | 3/2017 | Meyers | H01L 22/34 |
| 2017/0184666 A1* | 6/2017 | Pappu | G01R 31/3177 |
| 2017/0271277 A1* | 9/2017 | Shuto | H01L 23/562 |
| 2017/0345791 A1 | 11/2017 | Shih | |
| 2018/0138133 A1* | 5/2018 | Meyers | H01L 25/16 |
| 2019/0287872 A1* | 9/2019 | Goh | H01L 23/5283 |
| 2020/0066621 A1* | 2/2020 | Liu | H01L 25/03 |
| 2020/0075567 A1* | 3/2020 | Collins | H01L 21/4857 |
| 2020/0119250 A1* | 4/2020 | Xu | H10N 10/82 |
| 2020/0212011 A1* | 7/2020 | Pancholi | H01L 23/00 |
| 2020/0258852 A1* | 8/2020 | Gomes | H01L 25/50 |
| 2020/0312742 A1* | 10/2020 | Lofgreen | H10N 10/82 |
| 2021/0074695 A1* | 3/2021 | Gomes | H01L 25/0657 |
| 2021/0225828 A1* | 7/2021 | Collins | H01L 24/82 |
| 2021/0281286 A1* | 9/2021 | Goetz | H01L 23/481 |
| 2022/0271022 A1* | 8/2022 | Gomes | H01L 25/0652 |

FOREIGN PATENT DOCUMENTS

| | | | |
|---|---|---|---|
| WO | WO-2017049587 A1 * | 3/2017 | ............. H01L 23/13 |
| WO | WO-2019066969 A1 * | 4/2019 | ......... H01L 21/4853 |
| WO | WO-2019066985 | 4/2019 | |
| WO | WO-2019066985 A1 * | 4/2019 | ........... H01L 23/481 |
| WO | WO-2019132946 | 7/2019 | |
| WO | WO-2019132946 A1 * | 7/2019 | ........... H01L 23/481 |

OTHER PUBLICATIONS

International Preliminary Report on Patentability for International Patent Application No. PCT/US2017/068831 dated Jul. 9, 2020, 12 pgs.
Extended European Search Report for European Patent Application No. 17936698.4, dated Jul. 6, 2021, 8 pgs.

* cited by examiner

DEVICE, METHOD AND SYSTEM FOR PROVIDING A STACKED ARRANGEMENT OF INTEGRATED CIRCUIT DIES

CROSS-REFERENCE TO RELATED APPLICATION

This patent application is a divisional of U.S. patent application Ser. No. 16/646,460, filed Mar. 11, 2020, which is a U.S. National Phase Application under 35 U.S.C. § 371 of International Application No. PCT/US2017/068831, filed Dec. 28, 2017, entitled "DEVICE, METHOD AND SYSTEM FOR PROVIDING A STACKED ARRANGEMENT OF INTEGRATED CIRCUIT DIES," which designates the United States of America, the entire disclosure of which are hereby incorporated by reference in their entirety and for all purposes.

BACKGROUND

Technical Field

Embodiments described herein relate generally to the field of integrated circuit devices and more specifically, but not exclusively, to methods and apparatuses for interconnecting circuitry with a stacked-die device.

Background Art

Where integrated circuit (IC) dies can be packaged more densely on the surface of the circuit board, the dimensions and cost of a packaged module can be reduced and system performance improved. One possible method of improving packaging densities involves placing dies atop one another to form three-dimensional stacks referred to as stacked-die devices or stacked-chip devices. Stacked die technologies have increased in their proliferation and variety in recent years. Such die-stacking schemes include stacking a number of decreasing sized dies in order to facilitate the wire-bonds or stacking a number of same-sized dies using spacers, or employing a beveling technique or using "T-cut" dies for the upper dies.

As successive generations of semiconductor fabrication and packaging technologies continue to scale in size and in degree of integration, there is expected to be an increasing premium placed on incremental improvements which allow for variety in the design of IC die stacks.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide techniques and mechanisms for an IC die to provide both functionality of active circuit elements and interconnect functionality which enables one or more voltages and/or one or more signals to be passed to or from another IC die. In an embodiment, a first IC die is configured to be coupled with a second IC die in a stacked configuration. The first IC die may include first integrated circuitry comprising active circuit elements (e.g., including CMOS and/or other transistors) to couple to, and operate with, second integrated circuitry of the second IC die. In such an embodiment, the first IC die may further comprise interconnects that provide pass-through connectivity between opposite sides of the first IC die. When coupled to the second IC die, a first portion of the first IC die may be operable to function as a silicon interposer—e.g., wherein another portion of the first IC die is to provide a cache, controller, voltage regulator and/or other active circuit functionality to operate with the second IC die.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computer, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including IC dies which are arranged with one another in a stacked configuration.

Figure 1:
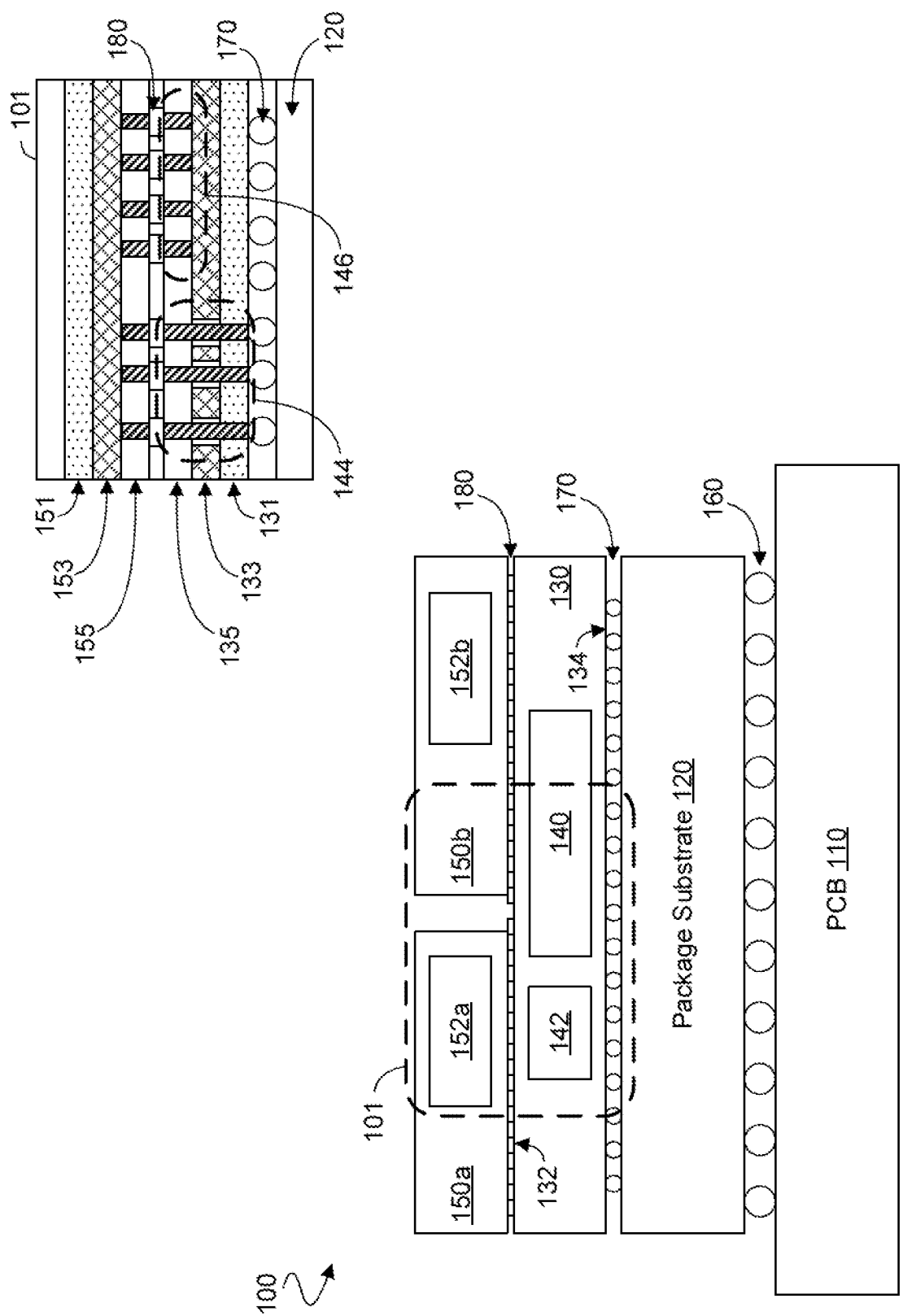
FIG. 1 is a cross-sectional diagram illustrating elements of an integrated circuit device according to an embodiment.

FIG. 1 shows a cross-sectional side view of a system 100 which includes a stacked arrangement of IC dies according to an embodiment. At least one such IC die may be coupled to provide both active circuit elements, available for access by another of the IC dies, and interposer-type functionality which passes one or more voltages and/or one or more signals for communication thereof using said other of the IC dies. An inset included in FIG. 1 shows a detail view of one region 101 of system 100.

By way of illustration and not limitation, system 100 may include a stacked arrangement of an IC die 130 and one or more other IC die 150*a* (and/or 150*b*) coupled thereto. For example, system 100 may include multiple side-by-side IC die 150*a*/150*b* on top, each connected to the single IC die 130 below. A side 132 of IC die 130 may have first contacts 180 (e.g., including metal pads, microbump solder joints and/or the like) disposed therein or thereon, wherein IC die 130 is configured to couple, via first contacts 180, to interface hardware which is disposed in or on an opposing side of IC die 150*a* (and/or 150*b*). Similarly, IC die 130 may further comprise second contacts 170 disposed in or on another side 134 which is opposite side 132. Second contacts 170 may facilitate additional coupling of IC die 130 to a package substrate 120, in some embodiments.

Package substrate 120 illustrates any of a variety of structures which include a ceramic, organic, and/or other suitable insulator material to provide physical support to IC die 130. Patterned conductors (not shown) of package substrate 120 may variously extend through such insulator material to facilitate routing of one or more voltages or signals to and/or from IC die 130. Such conductors—for example, including copper, gold, silver and/or the like—may be formed by patterned metal layers and vias variously coupled thereto. Package substrate 120 may include structures adapted from conventional package substrate designs—e.g., wherein package substrate 120 has a core or, alternatively, is coreless. System 100 may additionally or alternatively include any of a variety of wire bonding and/or other interconnect structures (not shown) to variously facilitate electrical coupling of some or all of IC dies 130, 150a (and/or 150b) and package substrate 120 with each other.

In some embodiments, additional contacts 160 disposed in or on a bottom side of package substrate 120 may facilitate further coupling of package substrate 120 to one or more other structures, such as the illustrative printed circuit board (PCB) 110 shown. PCB 110 may be thereby coupled to IC dies 130, 150a (and/or 150b) via conductors of package substrate 120. However, system 100 may alternatively omit PCB 110—e.g., where system 100 is a packaged IC device which is to couple to PCB 110 via contacts 160. In some embodiments, system 100 may further omit package substrate 120.

IC die 150a (and/or 150b) may include integrated circuitry 152a (and/or 152b) that is operable to access and/or otherwise operate with other circuitry of the stacked arrangement—e.g., wherein such other circuitry includes the illustrative integrated circuitry 140 of IC die 130. In such an embodiment, integrated circuitry 140 and integrated circuitry 152a (and/or 152b) may be coupled to one another via some of contacts 180. Moreover, integrated circuitry 152a/152b (and/or other circuitry of IC die 150a/150b) may be further coupled to some or all of contacts 170—e.g., via others of contacts 180 and via interconnect structures 142 of IC die 130. For example, interconnect structures 142 may couple various ones of contacts 180 each with a respective one of contacts 170. Some or all of such coupling via interconnect structures 142 may be independent of any active circuit elements of IC die 130.

Integrated circuitry 152a (and/or 152b) may include processor logic such as one or more cores of a central processing unit and/or a graphics processor. In such an embodiment, circuitry 140 may include any of a variety of active circuit elements which are configured to operate in response to said processor logic (e.g., by receiving and servicing requests from said processor logic) and/or to otherwise facilitate operation of said processor logic. By way of illustration and not limitation, integrated circuitry 140 may include a data cache (in some embodiments, comprising multiple levels of a hierarchical cache architecture) which is to cache data for access by a processor of integrated circuitry 152a/152b. Alternatively or in addition, integrated circuitry 140 may include a power delivery circuit to provide a supply voltage—and, in some embodiments, a reference voltage (e.g., a ground)—to integrated circuitry 152a/152b. In some embodiments, integrated circuitry 140 additionally or alternatively includes a memory controller, main memory logic—e.g., including a dynamic random access memory (DRAM) and/or the like. For example, integrated circuitry 152a (and/or 152b) may include a host processor and RAM memory logic, wherein integrated circuitry 140 includes memory controller logic by which the host processor is to access said RAM memory logic. In some embodiments, integrated circuitry 140 comprises input/output (I/O) circuitry including one or more protocol stacks configured to participate in communications according to a standard protocol.

As shown in the detail view of region 101, IC die 130 may include a semiconductor substrate 131 and a device layer 133 which comprises integrated circuits variously integrated with (e.g., formed in or on) semiconductor substrate 131. Such integrated circuits of device layer 133 may include complementary metal oxide semiconductor (CMOS) transistors and/or other active circuit elements configured to operate as a data cache, a main memory, a power delivery circuit, I/O circuitry and/or the like. However, some embodiments are not limited to a particular functionality that might be provided with integrated circuits of device layer 133.

IC die 130 may further comprise one or more metallization layers 135 which are disposed on device layer 133. The one or more metallization layers 135 may include patterned traces, vias and/or other conductive structures which variously enable coupling of device layer 133 with IC die 150a (and/or 150b). For example, device layer 133 may include some or all of integrated circuitry 140, wherein one or more metallization layers 135 include interconnects 146 each coupled between integrated circuitry 140 and a respective one of contacts 180. Although interconnects 146 are illustrated as via structures, it is to be appreciated in view of the description herein that the particular number and configuration of interconnects 146 is merely illustrative, and may include any of a variety of different patterned conductive paths, according to implementation-specific details.

As further shown in the detail view of region 101, IC die 150a (and/or 150b) may similarly include a semiconductor substrate 151 and a device layer 153 comprising integrated circuits disposed in or on semiconductor substrate 151. Active circuit elements of device layer 153 (e.g., including integrated circuitry 152a/152b) may provide a processor, memory, controller, hub, I/O circuitry and/or any of various other logic configured to communicate with integrated circuitry 140. Some embodiments are not limited to a particular functionality that might be provided with integrated circuits of device layer 153. One or more metallization layers 155 of IC die 150a (and/or 150b) may provide conductive structures to enable coupling of device layer 153 with IC die 130.

In an embodiment, additional interconnects of IC die 130 (e.g., including the illustrative interconnects 144 shown) are to be variously coupled each to a respective one of contacts 180 and a respective one of contacts 170—e.g., wherein contacts on opposite sides of IC die 130 are coupled to one another each via a signal path that excludes any active circuit elements. Interconnects 144 (which may include interconnect structures 142, for example) may variously function as respective "pass-through" conductive paths each to communicate a respective signal or a respective voltage between sides 132, 134. For example, interconnects 144 may pass through device layer 133, while being electrically insulated from any active circuit elements thereof. Accordingly, IC die 130 may provide both functionality of a data cache, memory, controller, I/O and/or other active circuit component, and additional functionality of an interposer which, for example, facilitates interconnection of IC die 150a (and/or 150b) and (for example) package substrate 120. Although interconnects 144 are illustrated as via structures, it is to be appreciated in view of the description herein that the particular number and configuration of interconnects 144 is merely illustrative, and may include any of a variety of different patterned conductive paths, according to implementation-specific details.

Figure 2:
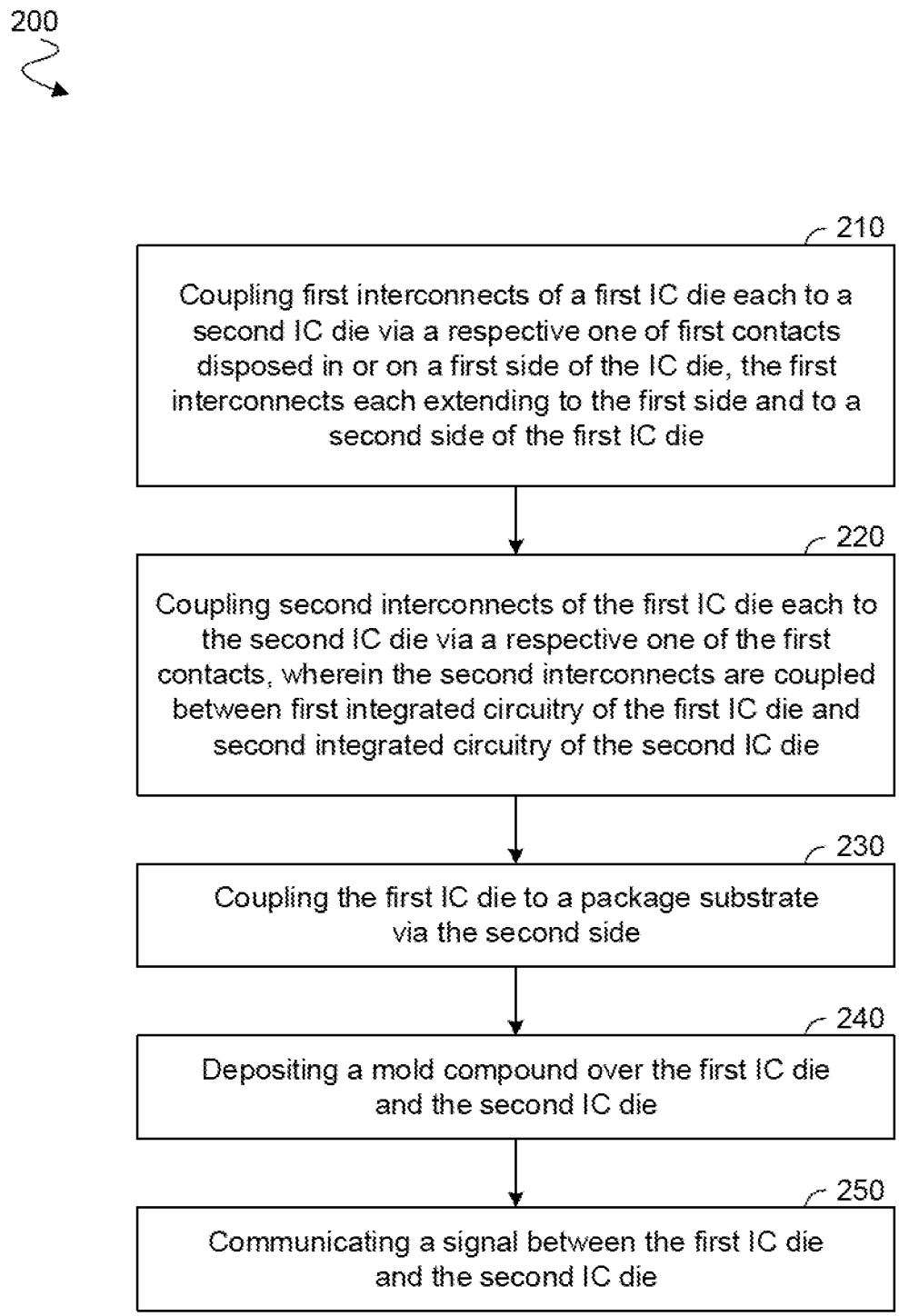
FIG. 2 is a flow diagram illustrating elements of a method to provide functionality of stacked IC dies according to an embodiment.

FIG. 2 shows operations of a method 200 to provide a stacked arrangement of IC dies according to an embodiment. Method 200 is one example of processing that couples an IC die to provide both functionality of active circuit elements—e.g., which are to operate as a cache, controller, power delivery unit, I/O receiver/transmitter and/or the like—and pass-through functionality which enables communication between another IC die and a package substrate or other such device. Method 200 may, for example, provide connectivity between structures of system 100.

In the illustrative embodiment shown, method 200 includes, at 210, coupling first interconnects of a first IC die each to a second IC die via a respective one of first contacts disposed in or on a first side of the IC die. For example, the first IC die, second IC die, first contacts and first side may be IC die 130, IC die 150a (and/or 150b), contacts 180 and side 132, respectively. The first interconnects (e.g., including interconnects 144) may each extend to the first side and to a second side of the first IC die (e.g., side 134) which is opposite the first side.

Method 200 may further comprise, at 220, coupling second interconnects of the first IC die each to the second IC die via a respective one of the first contacts. The second interconnects (e.g., including interconnects 146) may be coupled between first integrated circuitry of the first IC die and second integrated circuitry of the second IC die. For example, the first integrated circuitry and second integrated circuitry may include integrated circuitry 140 and integrated circuitry 152a (and/or 152b), respectively. The second integrated circuitry may, for example, include processor logic such as one or more processor cores of a central processing unit. Alternatively or in addition, the first integrated circuitry may include one or more of data cache, a power delivery circuit, an I/O protocol stack, a memory controller or the like.

By way of illustration and not limitation, the second integrated circuitry may include a processor and a memory (e.g., including one or more DRAM blocks), wherein the first integrated circuitry includes a memory controller to couple to each of the processor and the memory via the second interconnects. In such an embodiment, the memory controller may provide the processor with access to the memory. For example, the first IC die may receive from the second IC die a memory access request sent by a host processor for the memory controller. To service such a memory access request, the memory controller may send from the first IC die a corresponding command to read, write, refresh, activate or otherwise access a DRAM of the second IC die. In response to such commands, the DRAM may send one or more signals (e.g., including data which has been read, control signals, error correction information and/or the like) back to the memory controller at the first IC die. Based on such one or more signals, the memory controller may send back to the host processor of the second IC a communication which indicates that the memory access request has been serviced.

Although some embodiments are not limited in this regard, method 200 may additionally or alternatively include one or more operations to further couple the stacked IC dies to other circuit devices and/or to facilitate such further coupling. For example, method 200 may comprise, at 230, coupling the first IC die, via the second side thereof, to a package substrate. Method 200 may further comprise, for example, depositing a mold compound over the first IC die and the second IC die, at 240.

In some embodiments, method 200 additionally or alternatively includes, at 250, communicating a signal between the first IC die and the second IC die. For example, the communicating at 250 may include communicating a first signal, via the first interconnects, between the second IC die and package substrate or other device which is coupled to the first IC die via the second side. The communicating at 250 may additionally or alternatively include communicating a second signal between the first integrated circuitry and the second integrated circuitry via the second interconnects. In such an embodiment, the first integrated circuitry and the second integrated circuitry may participate in a sequence of signals including, for example, read and/or write requests and responses to access data in a cache, a DRAM or the like.

Figure 3:
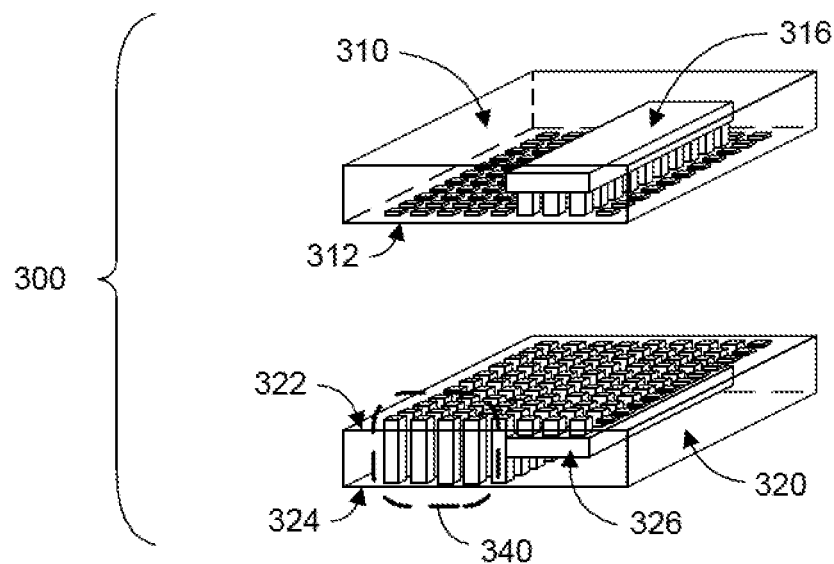
FIG. 3 is a perspective view of a stacked arrangement of IC dies according to an embodiment.

FIG. 3 shows an exploded view of an IC device 300 including a stacked configuration of IC dies according to another embodiment. Circuit structures of IC device 300 may have features of system 100—e.g., wherein fabrication, interconnection and/or operation of said structures is performed according to method 200.

In the embodiment shown, IC device 300 includes IC dies 310, 320 that, for example, correspond functionally to IC dies 150a, 130, respectively. IC die 320 may couple, via a side 322 thereof, to a side 312 of IC die 310. For example, such coupling may enable integrated circuitry 316 of IC die 310 to communicate, via respective metallization layers of IC dies 310, 320, with integrated circuitry 326 of IC die 320. In one example embodiment, integrated circuitry 316 includes one or more processors, wherein integrated circuitry 326 comprises (for example) a cache for data to be accessed by said one or more processors.

The one or more metallization layers of IC die 320 may further comprise other interconnects (such as the illustrative interconnects 340 shown) which facilitate pass-through connectivity between side 322 and a side 324 of IC die 320 which is opposite side 322. In such an embodiment, integrated circuitry 316 (or other circuitry of IC die 310) may be coupled to communicate signals via interconnects 340. Such communications may include signaling, received by integrated circuitry 316, which are to determine communication between integrated circuitry 316 and integrated circuitry 326. Alternatively or in addition, such communications may include signaling, output by integrated circuitry 316, which is based on communication between integrated circuitry 316 and integrated circuitry 326.

Figure 4:
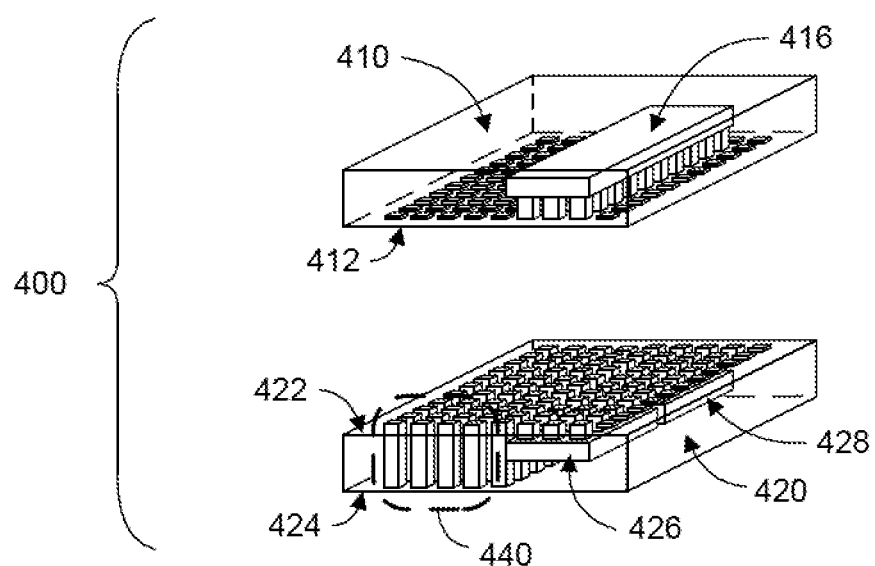
FIG. 4 is a perspective view of a stacked arrangement of IC dies according to an embodiment.

FIG. 4 shows an exploded view of an IC device 400 including stacked IC dies according to another embodiment. IC device 400 may have features of system 100 or IC device 300—e.g., where functionality of said structures is provided according to one or more operations of method 200.

In one embodiment, IC device 400 includes IC dies 410, 420 that, for example, correspond functionally to IC dies 150a, 130, respectively. IC dies 410, 420 may couple to one another via respective sides 412, 422—e.g., where such coupling enables integrated circuitry 416 of IC die 410 to communicate via metallization layers of IC dies 410, 420 with integrated circuitry of IC die 420 (such as the illustrative integrated circuit components 426, 428 shown). Integrated circuitry 416 may include (for example) one or more processor cores to execute a host operating system and/or any of various other software processes.

In such an embodiment, integrated circuit components 426, 428 may provide different functionality—e.g., wherein integrated circuit components 426, 428 are to be variously accessed by a processor of IC die 310 at different times and/or independent of one another. For example, integrated circuit components 426, 428 may include different respective ones of a data cache, a memory controller, a power delivery unit, an I/O protocol stack and/or the like. The one or more metallization layers of IC die 420 may further comprise other interconnects 440 which facilitate pass-through connectivity between side 422 and another side 424 of IC die 420 which is opposite side 422. Integrated circuitry 416 (or other circuitry of IC die 410) may be coupled to communicate signals via interconnects 440—e.g., where some or all such signals are to variously determine, or are variously based on, communications between integrated circuitry 416 and one or both of integrated circuit components 426, 428.

Figure 5:
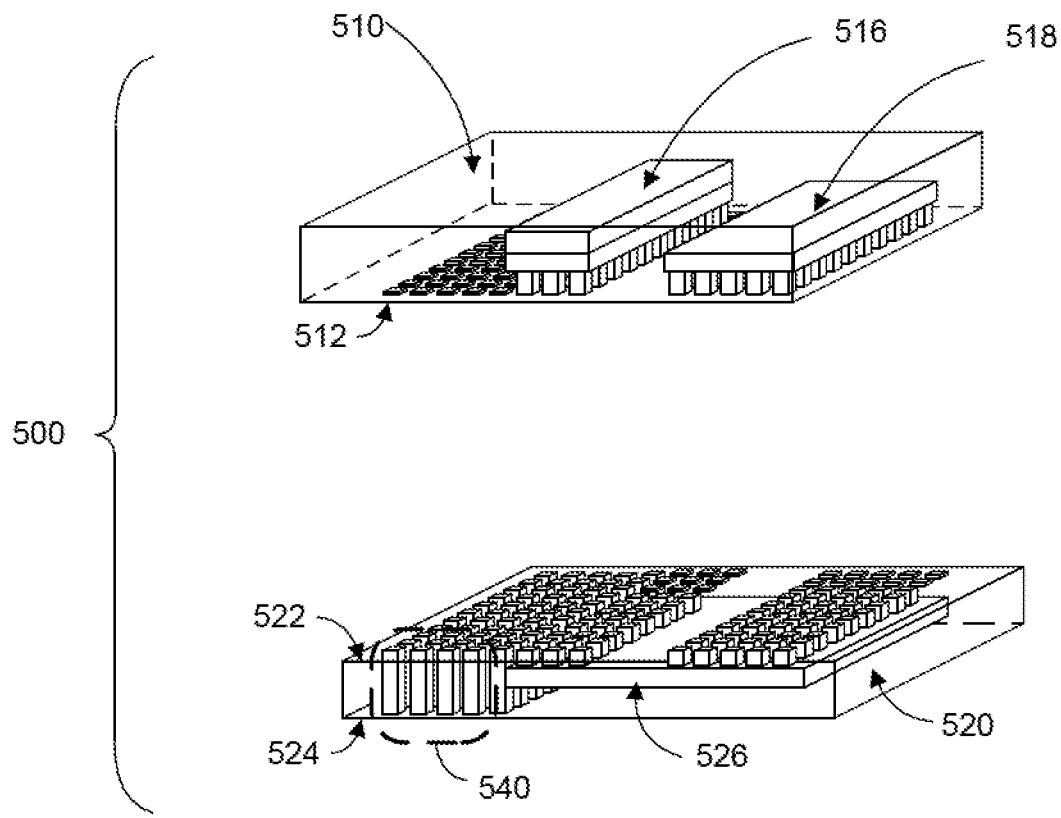
FIG. 5 is a perspective view of a stacked arrangement of IC dies according to an embodiment.

FIG. 5 shows an exploded view of an IC device 500 including stacked IC dies according to another embodiment. IC device 500 may have features of system 100 or one of IC devices 300, 400. In one embodiment, IC device 500 includes IC dies 510, 520 that, for example, correspond functionally to IC dies 150a, 130, respectively. IC dies 510, 520 may couple to one another via respective sides 512, 522—e.g., where such coupling enables integrated circuitry of IC die 510 (e.g., including circuit components 516, 518) to communicate via metallization layers of IC dies 510, 520 with integrated circuitry 526 of IC die 520. Circuit components 516, 518 may include (for example) a processor unit and, in some embodiments, one or more DRAM and/or other memory blocks to be accessed by the processor unit. By way of example only and not limitation, in the illustrated embodiment circuit component 516 includes two DRAM and/or other type of memory blocks arranged in a stacked configuration.

In such an embodiment, integrated circuit components 526 may provide functionality of a memory controller which is coupled to each of circuit components 516, 518. The memory controller may be configured to service requests from a host process executed by a processor of circuit components 516, 518, the requests to access data stored at a memory of circuit components 516, 518. Metallization layers of IC die 520 may further comprise other interconnects 540 which facilitate pass-through connectivity between opposite sides 522, 524 of IC die 520. Circuit components 516, 518 (or other circuit elements of IC die 510) may be coupled to communicate signals via interconnects 540—e.g., where some or all such signals are to variously determine, or are variously based on, communications between integrated circuitry 526 and one or both of integrated circuit components 516, 518.

Figure 6:
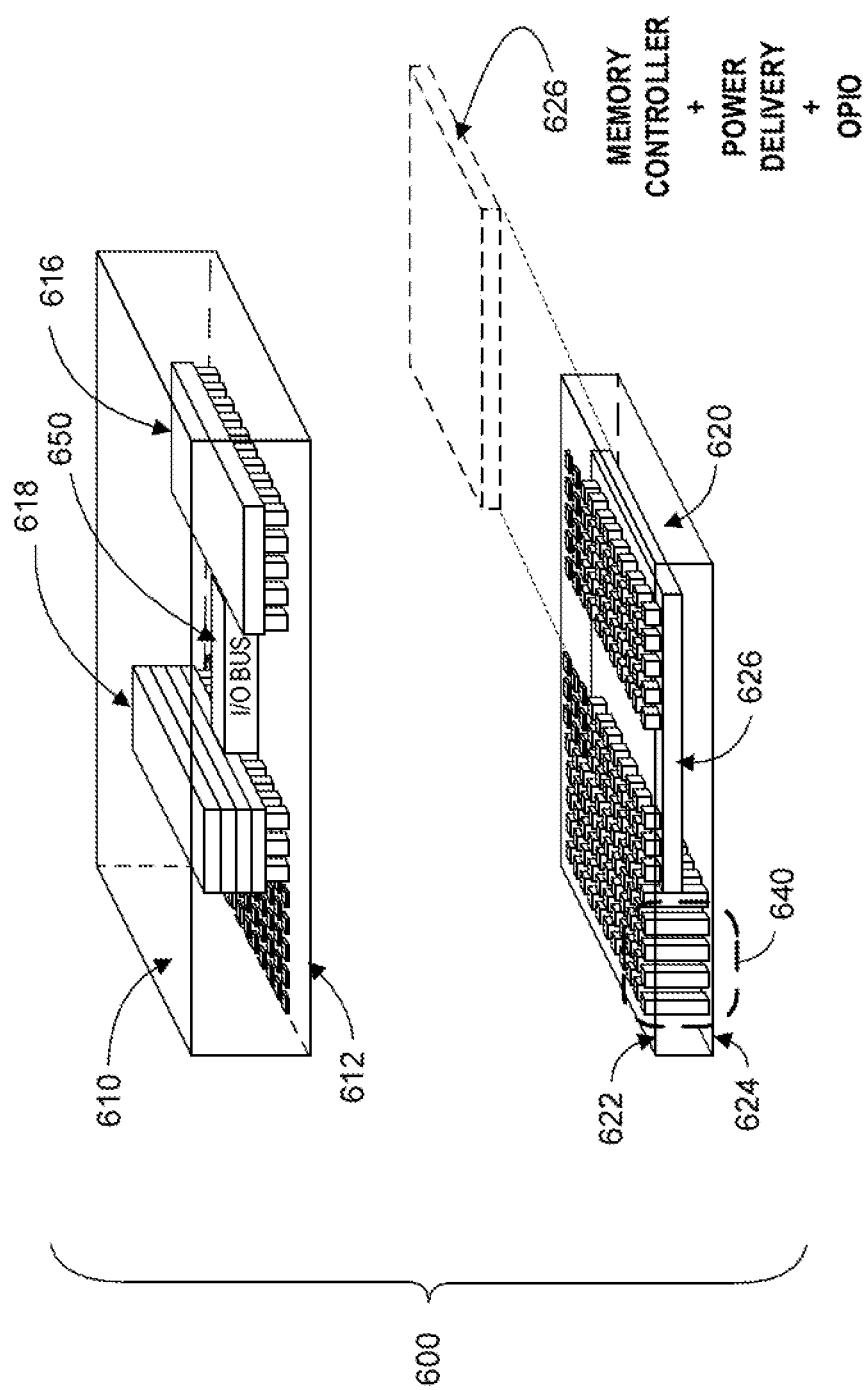
FIG. 6 is a perspective view of a stacked arrangement of IC dies according to an embodiment.

FIG. 6 shows an exploded view of an IC device 600 including stacked IC dies according to another embodiment. IC device 600 may have features of system 100 or one of IC devices 300, 400 and 500. In one embodiment, IC device 600 includes IC dies 610, 620 that, for example, correspond functionally to IC dies 150a, 130, respectively. IC dies 610, 620 may couple to one another via respective sides 612, 622—e.g., where such coupling enables integrated circuitry of IC die 610 (e.g., including circuit components 616, 618 and 650) to communicate via metallization layers of IC dies 610, 620 with integrated circuitry 626 of IC die 620. By way of example only and not limitation, circuit component 616 may include one or more DRAM and/or other memory blocks and circuit component 618 may include a processor unit(s). By way of example only and not limitation, in the illustrated embodiment circuit component 616 includes four DRAM and/or other type of memory blocks arranged in a stacked configuration. In addition, circuit component 650 may include an input/output (I/O) bus to facilitate high-bandwidth access between the processor unit(s) 618 and the one or more memory blocks 616.

In such an embodiment, by way of example only and not limitation, the IC device 600 may provide functionality of a memory controller as well as power delivery and an on-package input-output (OPIO) interface as shown in an exploded view of integrated circuit components 626, all of which may be coupled to each of circuit components 616, 618 and 650. The memory controller may be configured to service requests from a host process executed by a processor of circuit components 618 using the OPIO interface and I/O bus 650, the requests including requests to access data stored at a memory of circuit components 616, e.g. a DRAM memory block.

In such an embodiment, by way of example only and not limitation, the functionality of the OPIO interface and I/O bus 650 reduces the need for large numbers of DRAM channels when IC device 600 is integrated into a system on a chip (SOC) or central processing unit (CPU). The power delivery and OPIO interface functionality in circuit components 626 and I/O bus 650 enables high-speed low-voltage transfer rates between the memory 616, processor unit 618, and memory controller 626 circuit components, thereby facilitating higher bandwidth access to the memory with lower power consumption.

In such an embodiment, metallization layers of IC die 620 may further comprise other interconnects 640 which facilitate pass-through connectivity between opposite sides 622, 624 of IC die 620. Circuit components 616, 618 and 650 (or other circuit elements of IC die 610) may be coupled to communicate signals via interconnects 640—e.g., where some or all such signals are to variously determine, or are variously based on, communications between integrated circuitry 626 and one or more of integrated circuit components 616, 618 and 650.

Figure 7:
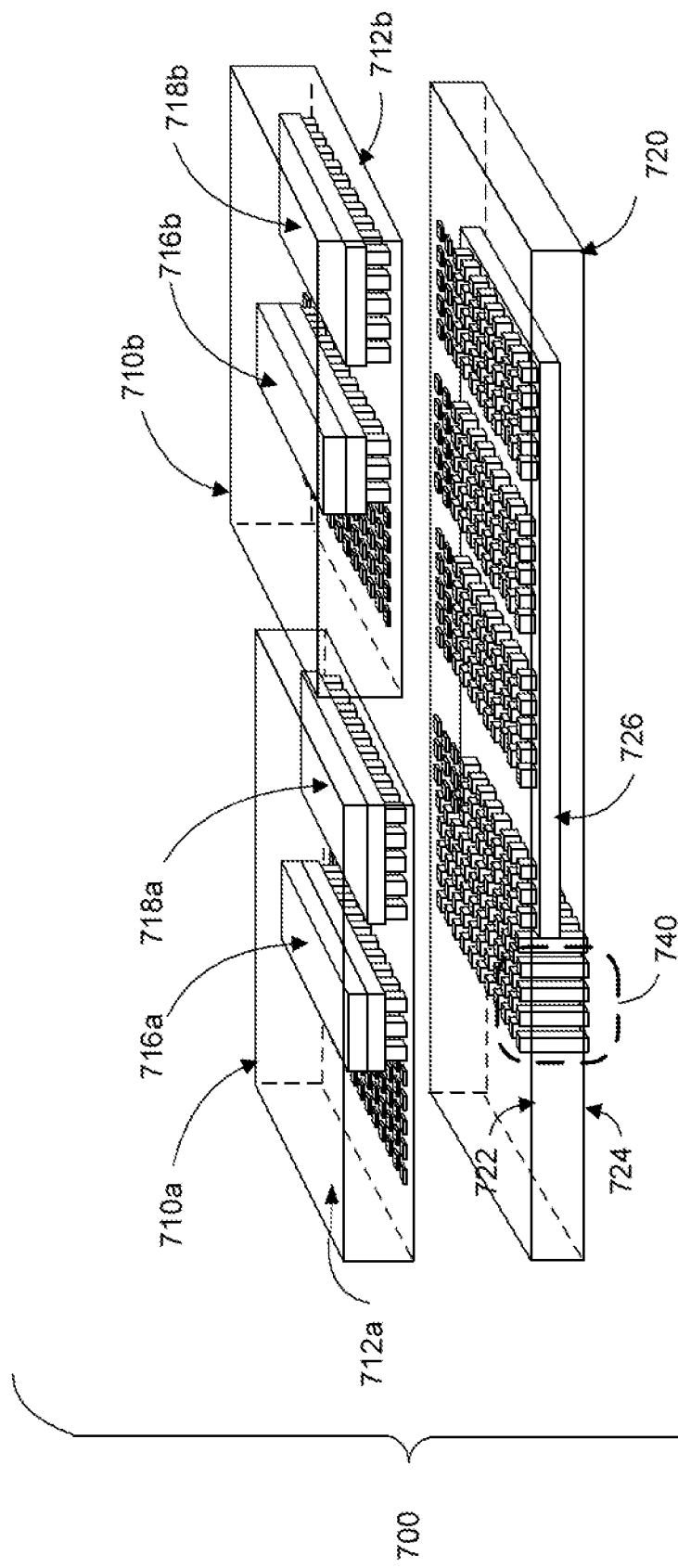
FIG. 7 is a perspective view of a stacked arrangement of IC dies according to an embodiment.

FIG. 7 shows an exploded view of an IC device 700 including stacked IC dies according to another embodiment. IC device 700 may have features of system 100 and one of IC devices 300, 400, 500 and 600. In one embodiment, IC device 700 includes IC dies 710a and 710b that, for example, correspond functionally to IC die 150a and 150b, wherein both IC dies 710a/710b are stacked side by side on top of a single lower IC die 720 that, for example, corresponds functionally to IC die 130. IC dies 710a, 710b and 720 may couple to one another via respective sides 712a/712b, 722—e.g., where such coupling enables integrated circuitry of IC die 710a/710b (e.g., including circuit components 716a/716b, 718a/718b) to communicate via metallization layers of IC dies 710a, 710b and 720 with integrated circuitry 726 of IC die 720. Circuit components 716a/716b, 718a/718b may include (for example) a processor unit and, in some embodiments, one or more DRAM and/or other memory blocks to be accessed by the processor unit. By way of example only and not limitation, in the illustrated embodiment circuit components 716a/716b each include two DRAM and/or other type of memory blocks arranged in a stacked configuration.

In such an embodiment, integrated circuit components 726 may provide functionality of a memory controller which is coupled to each of circuit components 716a/716b, 718a/718b. The memory controller may be configured to service requests from a host process executed by a processor of circuit components 716a/716b, 718a/718b, the requests to access data stored at a memory of circuit components 716a/716b, 718a/718b. Metallization layers of IC die 720 may further comprise other interconnects 740 which facilitate pass-through connectivity between opposite sides 722,

724 of IC die 720. Circuit components 716a/716b, 718a/718b (or other circuit elements of IC dies 710a and/or 710b) may be coupled to communicate signals via interconnects 740—e.g., where some or all such signals are to variously determine, or are variously based on, communications between integrated circuitry 726 and any one or more of integrated circuit components 716a/716b, 718a/718b.

Figure 8:
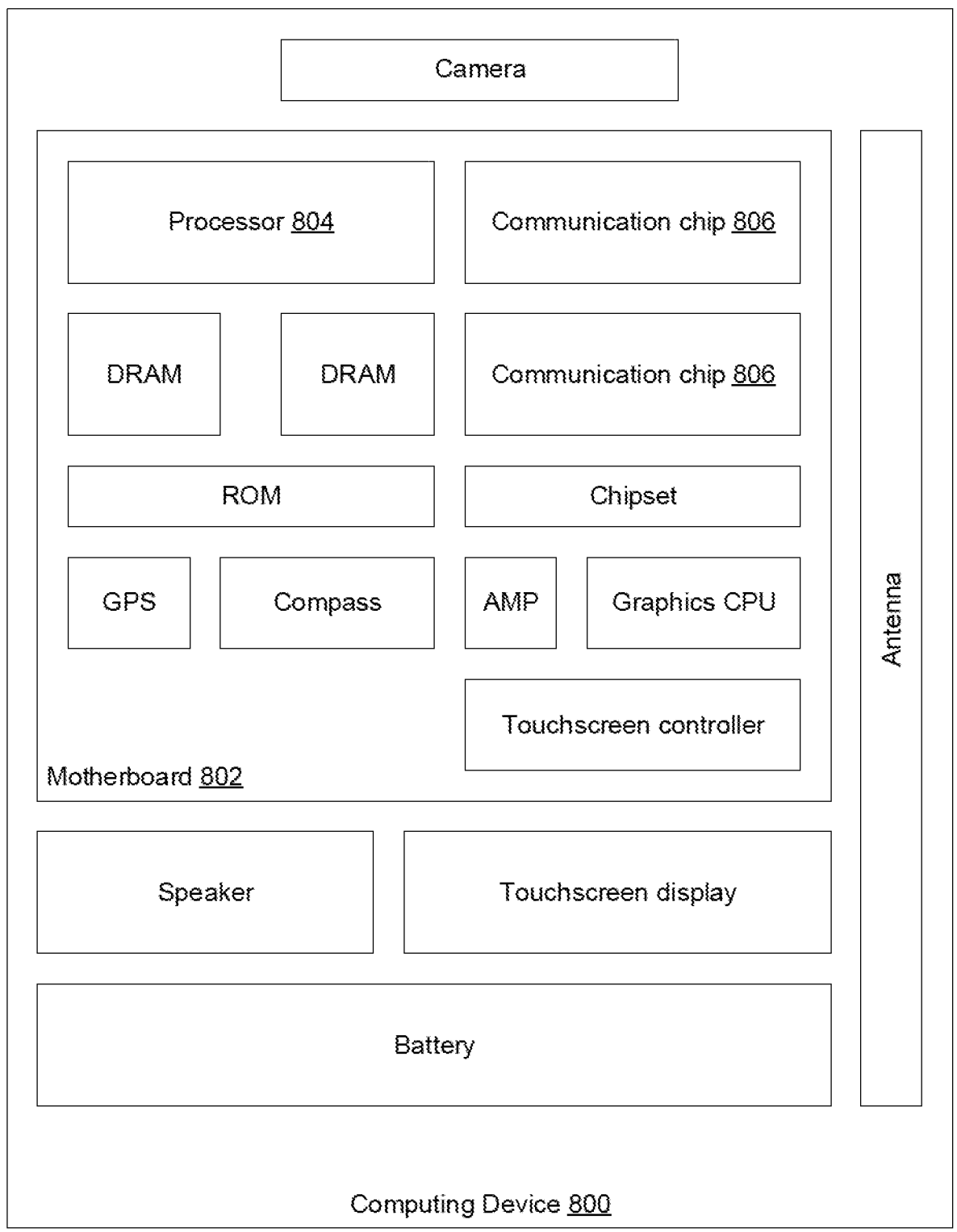
FIG. 8 is a functional block diagram illustrating elements of a computing device in accordance with one embodiment.

FIG. 8 illustrates a computing device 800 in accordance with one embodiment. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. The term "processor" may refer to any device or portion of a device that processes electronic data from registers and/or memory to transform that electronic data into other electronic data that may be stored in registers and/or memory. The communication chip 806 also includes an integrated circuit die packaged within the communication chip 806.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 9:
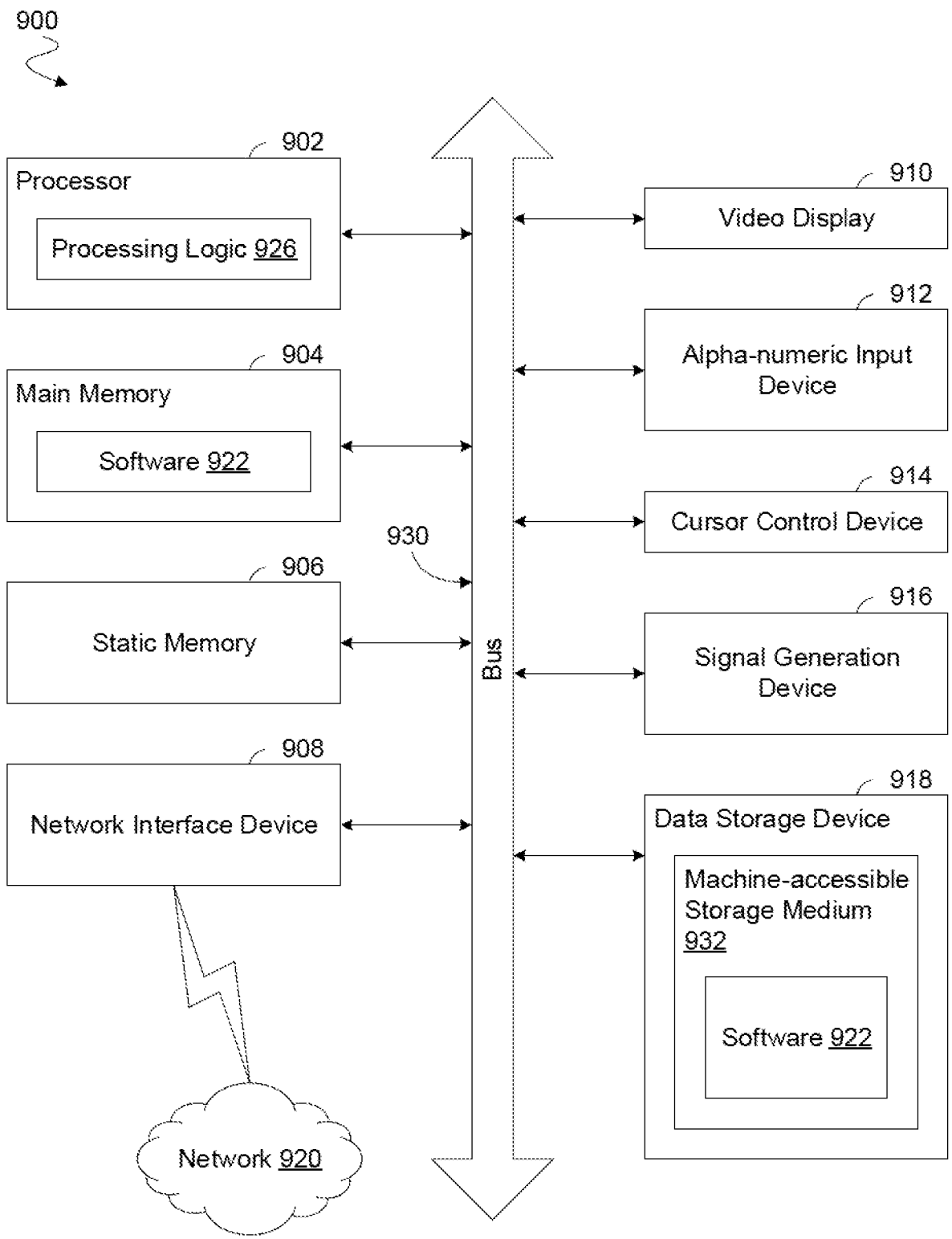
FIG. 9 is a functional block diagram illustrating elements of an exemplary computer system, in accordance with an embodiment.

FIG. 9 illustrates a diagrammatic representation of a machine in the exemplary form of a computer system 900 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations described herein.

The computer system 900 may further include a network interface device 908. The computer system 900 also may include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 932 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

While the machine-accessible storage medium 932 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, an integrated circuit (IC) die comprises first contacts disposed in or on a first side of the IC die, wherein the IC die is configured to couple to a second IC die via the first contacts, second contacts disposed in or on a second side of the IC die, the second side opposite the first side, first integrated circuitry including first active circuit elements to communicate with second integrated circuitry of the second IC die, first interconnects each extending to the first side and to the second side, and second interconnects each coupled between the first side and the first integrated circuitry, wherein the first interconnects and the second interconnects each to couple to the second IC die via a respective one of the first contacts.

In one embodiment, the second integrated circuitry is to include a processor. In another embodiment, the first integrated circuitry includes a data cache. In another embodiment, the first integrated circuitry includes a power delivery circuit. In another embodiment, the first integrated circuitry includes a protocol stack. In another embodiment, the second integrated circuitry is to include a processor and a memory, and wherein the first integrated circuitry includes a memory controller to couple to each of the processor and the memory via the second interconnects, the memory controller to provide the processor with access to the memory.

In another implementation, a method comprises coupling first interconnects of a first integrated circuit (IC) die each to a second IC die via a respective one of first contacts disposed in or on a first side of the IC die, the first interconnects each extending to the first side and to a second side of the first IC die, the second side opposite the first side, and coupling second interconnects of the first IC die each to the second IC die via a respective one of the first contacts, wherein the second interconnects are coupled between first integrated circuitry of the first IC die and second integrated circuitry of the second IC die.

In another embodiment, the method further comprises coupling the first IC die to a package substrate via the second side. In another embodiment, the method further comprises depositing a mold compound over the first IC die and the second IC die. In another embodiment, the second integrated circuitry is to include a processor. In another embodiment, the first integrated circuitry includes a data cache. In another embodiment, the first integrated circuitry includes a power delivery circuit. In another embodiment, the first integrated circuitry includes a protocol stack. In another embodiment, the second integrated circuitry is to include a processor and a memory, and wherein the first integrated circuitry includes a memory controller to couple to each of the processor and the memory via the second interconnects, the memory controller to provide the processor with access to the memory.

In another implementation, a system comprises a first integrated circuit (IC) die including first integrated circuitry, and a second IC die including first contacts disposed in or on a first side of the second IC die, wherein the second IC die is coupled to the first IC die via the first contacts, second contacts disposed in or on a second side of the second IC die, the second side opposite the first side, second integrated circuitry including first active circuit elements to communicate with the first integrated circuitry, first interconnects each extending to the first side and to the second side, and second interconnects each coupled between the first side and the second integrated circuitry, wherein the first interconnects and the second interconnects each to couple to the first IC die via a respective one of the first contacts. The system further comprises a display device coupled to the first IC die via the second IC die, the display device to display an image based on a signal output by the second IC die.

In one embodiment, the first integrated circuitry is to include a processor. In another embodiment, the second integrated circuitry includes a data cache. In another embodiment, the second integrated circuitry includes a power delivery circuit. In another embodiment, the second integrated circuitry includes a protocol stack. In another embodiment, the first integrated circuitry is to include a processor and a memory, and wherein the second integrated circuitry includes a memory controller to couple to each of the processor and the memory via the second interconnects, the memory controller to provide the processor with access to the memory.

In one embodiment, the second integrated circuitry includes a processor, a memory and an input/output bus. In one embodiment, the first integrated circuitry includes each of a memory controller, a power delivery circuit and an on-package input-output (OPIO) interface component, the first integrated circuitry to couple to each of the processor and the memory and the input/output bus via the second interconnects, wherein the memory controller, power delivery circuit and OPIO interface are to provide the processor with access to the memory at higher bandwidth with lower power consumption.

Techniques and architectures to enable coupling of integrated circuit chips are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention.

The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A system comprising
a first integrated circuit (IC) die including first integrated circuitry;
a second IC die including:
first contacts disposed in or on a first side of the second IC die, wherein the second IC die is coupled to the first IC die via the first contacts;
second contacts disposed in or on a second side of the second IC die, the second side opposite the first side;
second integrated circuitry including first active circuit elements to communicate with the first integrated circuitry;
first interconnects each extending to the first side and to the second side; and
second interconnects each coupled between the first side and the second integrated circuitry, wherein the first interconnects and the second interconnects each to couple to the first IC die via a respective one of the first contacts; and
a display device coupled to the first IC die via the second IC die, the display device to display an image based on a signal output by the second IC die.

2. The system of claim 1, wherein the first integrated circuitry is to include a processor.

3. The system of claim 1, wherein the second integrated circuitry includes a data cache.

4. The system of claim 1, wherein the second integrated circuitry includes a power delivery circuit.

5. The system of claim 1, wherein the second integrated circuitry includes a protocol stack.

6. The system of claim 1, wherein the first integrated circuitry is to include a processor and a memory, and wherein the second integrated circuitry includes a memory controller to couple to each of the processor and the memory via the second interconnects, the memory controller to provide the processor with access to the memory.

7. The system of claim 1, wherein the second integrated circuitry is to include a processor and a memory and an input/output bus, and wherein the first integrated circuitry includes each of a memory controller, a power delivery circuit and an on-package input-output (OPIO) interface component, the first integrated circuitry to couple to each of the processor and the memory and the input/output bus via the second interconnects, the memory controller, power delivery circuit and OPIO interface to provide the processor with access to the memory at higher bandwidth with lower power consumption.

8. A computing device, comprising:
a board; and
a component coupled to the board, the component including an integrated circuit structure, comprising:
first contacts disposed in or on a first side of an IC die, wherein the IC die is configured to couple to a second IC die via the first contacts;
second contacts disposed in or on a second side of the IC die, the second side opposite the first side;
first integrated circuitry including first active circuit elements to communicate with second integrated circuitry of the second IC die;
first interconnects each extending to the first side and to the second side, the first interconnects having a first vertical length; and
second interconnects each coupled between the first side and the first integrated circuitry, the second interconnects having a second vertical length less than the first vertical length, wherein the first interconnects and the second interconnects each to couple to the second IC die via a respective one of the first contacts.

9. The computing device of claim 8, further comprising: a memory coupled to the board.

10. The computing device of claim 8, further comprising: a communication chip coupled to the board.

11. The computing device of claim 8, further comprising: a camera coupled to the board.

12. The computing device of claim 8, further comprising: a GPS coupled to the board.

13. The computing device of claim 8, further comprising: a compass coupled to the board.

14. The computing device of claim 8, further comprising: a graphics CPU coupled to the board.

15. The computing device of claim 8, further comprising: a touchscreen controller coupled to the board.

16. The computing device of claim 8, further comprising: a speaker coupled to the board.

17. The computing device of claim 8, further comprising: a touchscreen display coupled to the board.

18. The computing device of claim 8, further comprising: a battery coupled to the board.

19. The computing device of claim 8, further comprising: an AMP coupled to the board.

20. The computing device of claim 8, further comprising: the second IC die coupled to the IC die.

\* \* \* \* \*